(12) United States Patent
Mochizuki

(10) Patent No.: US 7,397,835 B2
(45) Date of Patent: Jul. 8, 2008

(54) SURFACE-EMITTING TYPE SEMICONDUCTOR LASER

(75) Inventor: Masamitsu Mochizuki, Chimo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/566,402

(22) Filed: Dec. 4, 2006

(65) Prior Publication Data

US 2007/0258499 A1    Nov. 8, 2007

(30) Foreign Application Priority Data

Jan. 12, 2006 (JP) .............................. 2006-005322

(51) Int. Cl.
*H01S 3/04* (2006.01)
*H01S 5/00* (2006.01)

(52) U.S. Cl. ........................ 372/50.124; 372/34; 372/36

(58) Field of Classification Search .................... 372/34, 372/36, 50.124

See application file for complete search history.

(56) References Cited

U.S. PATENT DOCUMENTS 7,085,301 B2 * 8/2006 Choquette et al. ...... 372/50.124

2004/0091010 A1    5/2004  Choquette et al.
2006/0093008 A1    5/2006  Mochizuki
2007/0147459 A1 *  6/2007  Ueki ..................... 372/50.124

FOREIGN PATENT DOCUMENTS

| EP | 0 653 823 A2 | 5/1995 |
| EP | 1 528 647 A2 | 5/2002 |
| JP | A 2003-086895 | 3/2003 |
| WO | WO 02/073753 A2 | 9/2002 |

OTHER PUBLICATIONS

Wipiejewski T. et al.: "Improved performance of vertical-cavity surface-emitting laser diodes with Au-plated heat spreading layer" Electronics Letters, Iee Stevenage, GB, vol. 31, No. 4, Feb. 16, 1995, pp. 279-281, XP006002449.

* cited by examiner

*Primary Examiner*—Armando Rodriguez
(74) *Attorney, Agent, or Firm*—Oliff & Berridge, PLC

(57) ABSTRACT

A surface-emitting type semiconductor laser includes: a first mirror; an active layer formed above the first mirror; a second mirror formed above the active layer; and a current constricting section formed above or below the active layer, wherein the second mirror has a plurality of concave sections arranged within a plane perpendicular to a light emission direction, and a light confining region surrounded by the concave sections is formed inside a region surrounded by the current constricting section as viewed in a plan view.

8 Claims, 5 Drawing Sheets

SURFACE-EMITTING TYPE SEMICONDUCTOR LASER

The entire disclosure of Japanese Patent Application No. 2006-005322, filed Jan. 12, 2006 is expressly incorporated by reference herein.

BACKGROUND

1. Technical Field

The present invention relates to surface-emitting type semiconductor lasers.

2. Related Art

In response to substantial increase in data amount and versatile of utility in surface-emitting type semiconductor lasers in recent years, it is desired to reduce the number of oscillation modes while maintaining a high power output. In general, the number of oscillation modes may be reduced by reducing the volume of each resonator.

It is noted that the output of a semiconductor laser increases with an increase in the current value injected, and reaches a maximum value (i.e., a rolloff point) at a certain current value. This is because, in a semiconductor laser, its gain spectrum shift with an increase in the device temperature which is caused by the current injected, and the gain reaches a maximum value at a certain temperature. When the volume of a resonator is relatively small, the temperature of the device would readily elevate, and its rolloff point is reached at a relatively low current value, such that a sufficient output or current driving range may not be obtained. When a sufficient output cannot be obtained, the driving point and the rolloff point come closer to each other, and fluctuation in the output caused by the surrounding temperature may become greater unless the driving current range is narrowed. In this connection, to prevent an increase in the device temperature, Japanese laid-open patent application JP-A-2003-86895 describes a method in which a groove reaching the current constricting section is formed around the light emitting section, and an electrode is directly formed over the groove. As a result, the distance between a heat generating section and the electrode is shortened, thereby improving the heat radiation efficiency.

SUMMARY

In accordance with an advantage of some aspects of the present invention, it is possible to provide a surface-emitting type semiconductor laser in which the number of modes can be reduced and a high power output can be maintained.

In accordance with an embodiment of the invention, a surface-emitting type semiconductor laser includes: a first mirror, an active layer formed above the first mirror, a second mirror formed above the active layer, and a current constricting section formed above or below the active layer, wherein the second mirror has a plurality of concave sections arranged within a plane perpendicular to a light emission direction, and a light confining region surrounded by the concave sections is formed inside a region surrounded by the current constricting section as viewed in a plan view.

The surface-emitting type semiconductor laser in accordance with an aspect of the embodiment of the invention may include a first columnar section formed from at least the active layer, the second mirror and the current constricting section, wherein the first columnar section may include a third columnar section having the active layer and the current constricting section and a second columnar section formed above the third columnar section and having a diameter smaller than that of the active layer, and an electrode formed on a top surface of the third columnar section and around the second columnar section.

The surface-emitting type semiconductor laser in accordance with an aspect of the embodiment of the invention may further include a heat radiation film formed above the second mirror.

In the surface-emitting type semiconductor laser in accordance with an aspect of the embodiment of the invention, the heat radiation film may have optical transparency.

In the surface-emitting type semiconductor laser in accordance with an aspect of the embodiment of the invention, the heat radiation film may be composed of a conductive material, and an insulation layer having optical transparency may be provided between the second mirror and the heat radiation film.

The surface-emitting type semiconductor laser in accordance with an aspect of the embodiment of the invention may further include a conductive film formed on an entire surface above the second mirror, a first heat radiation film formed above the conductive film, and a second heat radiation film formed above the first heat radiation film, wherein the conductive film functions as an electrode for driving the surface-emitting type semiconductor laser, and the second heat radiation film is composed of a conductive material and is electrically connected to the conductive film.

In the surface-emitting type semiconductor laser in accordance with an aspect of the embodiment of the invention, the insulation film may be embedded inside the concave sections.

In the surface-emitting type semiconductor laser in accordance with an aspect of the embodiment of the invention, the second mirror may include a dielectric mirror.

The surface-emitting type semiconductor laser in accordance with an aspect of the embodiment of the invention may further include a dielectric mirror formed above the second mirror, wherein a lowermost layer of the dielectric mirror may be embedded in the concave sections.

DESCRIPTION OF EXEMPLARY EMBODIMENTS

Preferred embodiments of the invention are described below with reference to the accompanying drawings.

1. Surface-emitting Type Semiconductor Laser

Figure 1:
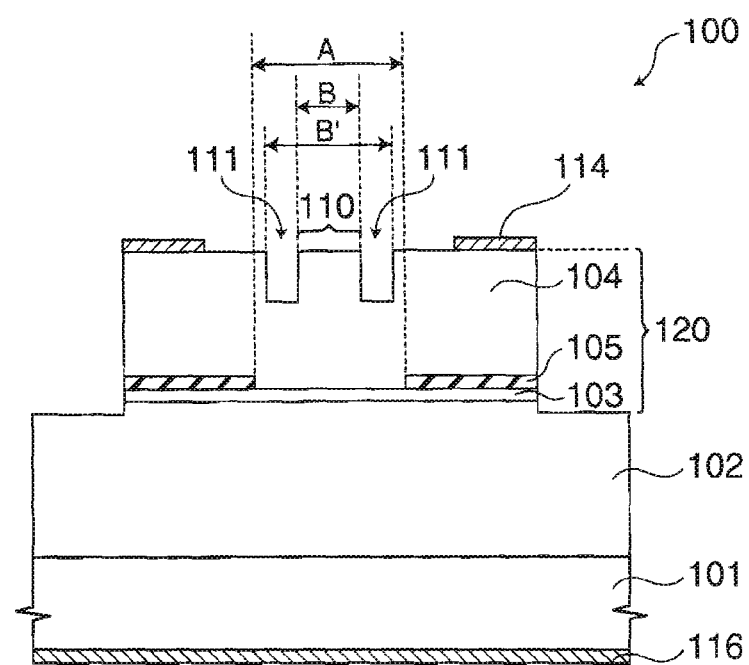
FIG. 1 is a schematic cross-sectional view of a surface-emitting type semiconductor laser in accordance with an embodiment of the invention.

FIG. 1 is a schematic cross-sectional view of a surface-emitting type semiconductor laser 100 in accordance with an embodiment of the invention.

Figure 2:
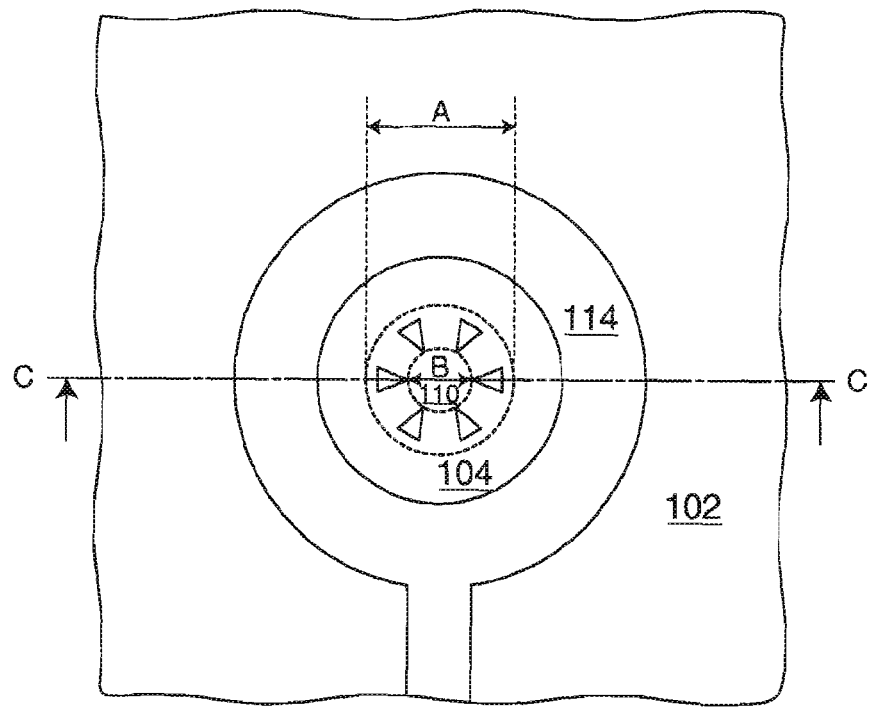
FIG. 2 is a schematic plan view of the surface-emitting type semiconductor laser in accordance with the embodiment of the invention.

FIG. 2 is a schematic plan view of the surface-emitting type semiconductor laser 100 in accordance with the embodiment. FIG. 1 is a cross-sectional view taken along a line C-C of FIG. 2.

The surface-emitting type semiconductor laser 100 includes a substrate 101, a first mirror 102, an active layer 103 and a second mirror 104. The surface-emitting type semiconductor laser 100 includes a vertical resonator, and may include a columnar semiconductor deposited body (hereafter referred to as a "columnar section") 120, as shown in FIG. 1. The first columnar section 120 is composed of a portion of the first mirror 102, the active layer 103 and the second mirror 104.

The substrate 101 may be formed from a semiconductor substrate, for example, an n-type GaAs substrate. The first mirror 102 may be composed of, for example, a distributed reflection type multilayer mirror of 40 pairs of alternately laminated n-type $Al_{0.9}Ga_{0.1}As$ layers and n-type $Al_{0.15}Ga_{0.85}As$ layers. The active layer 103 may be composed of, for example, GaAs well layers and $Al_{0.3}Ga_{0.7}As$ barrier layers in which the well layers include a quantum well structure composed of three layers. The second mirror layer 104 may be composed of, for example, a distributed reflection type multilayer mirror of 25 pairs of alternately laminated p-type $Al_{0.9}Ga_{0.1}As$ layers and p-type $Al_{0.15}Ga_{0.85}As$ layers.

The second mirror 104 may be made to be p-type by doping, for example, carbon (C), and the first mirror 102 may be made to be n-type by doping, for example, silicon (Si). Accordingly, the p-type second mirror 104, the active layer 103 that is not doped with any impurity, and the n-type first mirror 102 form a pin diode. It is noted that, in the present exemplary embodiment, the second columnar section 120 has a circular shape in a plan view in the present embodiment, but may have any other arbitrary shape.

The second mirror 104 further includes a current constricting section 105 formed in a region near the active layer. The current constricting section 105 may be formed from an oxidized constricting region or a proton implanted region. The current constricting section 105 may be obtained by oxidizing, for example, an $Al_xGa_{1-x}As$ (x>0.95) layer from its side surface, and may have a ring shape in a plan view.

The second mirror 104 includes a plurality of concave sections 111. The convex sections 110 can function as a light confining structure like a known two-dimensional photonic crystal or a holey fiber. Therefore, the second mirror 104 can have a cyclical refractive index distribution in a plane traversing the direction of laser light emission, due to the concave sections 111. The concave sections 111 may be arranged in a triangle lattice configuration or a square lattice configuration. The concave section 111 may have a cross-sectional shape that is not only a symmetrical shape, such as, for example, a cylindrical shape, but also an asymmetrical shape having a taper, such as, for example, a conical shape. The concave section 111 in the present embodiment is triangular, but may be in a polygonal shape other than a triangle or a circular shape, without any particular limitation to the embodiment.

Furthermore, if another material is filled in the concave sections 111, a material causing a great refractive index difference with respect to the materials of the second mirror 104 may preferably be selected.

The light confining region 110 surrounded by the concave sections 111 has a plane configuration that may be a circular shape indicated by a dotted line in FIG. 2, and a diameter B of the light confining region 110 is smaller than an inner diameter A of the current constricting section 105. As a result, light confinement occurs inside the concave sections 111, and the number of oscillation modes is determined by the diameter B of the light confining region 110. On the other hand, the current is confined by the current constricting section 105. Therefore, by enlarging the inner diameter A of the current constricting section 105, the amount of generation of Joule heat caused by the resistance can be reduced, and localized temperature increase can be prevented, such that the amount of current at a rolloff point can be made greater, and a high power output can be obtained without increasing the number of oscillation mode. Furthermore, as the current level reaching a rolloff point moves away from the driving current range due to the high power output, such that operations in a wider temperature range can be made possible. In other words, by enlarging the inner diameter A of the current constricting section 105 and at the same time reducing the diameter B of the light confining region 110, the number of oscillation modes can be reduced, and a high power output can be maintained. It is noted that there may be a case where, when the depth of the concave sections 111 is became greater from zero depth (i.e. no concave), the optical confinement is gradually shifted, and the oscillation mode is transiently determined by a region inside an outer diameter B' but outside the diameter B of the concave sections 111. Such a case is also included in the invention. In the present embodiment, the current confining region and the light confining region only need to have different diameters, and the state of "light confining region surrounded by the concave sections" includes such a transient state, in other words, a state in which the light confining region is defined by a region inside the outer diameter B' of the concave sections 111 but outside the diameter B thereof.

It is noted that the diameter B of the light confining region 110 can be appropriately adjusted according to a desired number of modes, a designed wavelength and the like.

Also, the surface-emitting type semiconductor laser 100 further includes a first electrode 114 and a second electrode 116. The first electrode 114 and the second electrode 116 are used to drive the surface-emitting type semiconductor laser 100.

More concretely, as shown in FIG. 1, the first electrode 114 is formed on a top surface of the second mirror 104. The second electrode 116 is formed on a back surface of the semiconductor substrate 101. The first electrode 114 may have a plane configuration that is in a ring shape, for example, as shown in FIG. 2. Also, the first electrode 114 may have a linear lead-out section that is lead out from the ring shaped section that is in contact with the top surface of the second mirror 104.

The second electrode 116 may be composed of, for example, a laminated film of an alloy of gold (Au) and germanium (Ge), and gold (Au). Also, the first electrode 114 may be composed of, for example, a laminated film of platinum (Pt), titanium (Ti) and gold (Au). Electrical current is injected in the active layer 103 by the first electrode 114 and the second electrode 116. It is noted that the materials for forming the first electrode 114 and the second electrode 116 are not limited to those described above, and other materials, such as, for example, an alloy of gold (Au) and zinc (Zn) can be used.

The surface-emitting type semiconductor laser 100 defines an emission surface inside the first electrode 114 and can emit light upwardly from the inside of the first electrode 114.

It is noted that, in the present embodiment, the second electrode 116 is provided on the back surface of the semiconductor substrate 101, but may be provided on the upper side surface of the first mirror 102.

Moreover, in accordance with the present embodiment, the second mirror 104 is formed from a semiconductor multilayer film. Instead, a part or the entirety of the second mirror 104 may be formed from a dielectric mirror. For example, only an upper portion of the second mirror 104 may be composed of a dielectric mirror. In this case, the concave sections 111 may be formed only in the dielectric mirror, but may penetrate the dielectric mirror.

2. Method for Manufacturing Surface-emitting Type Semiconductor Laser

Figure 3:
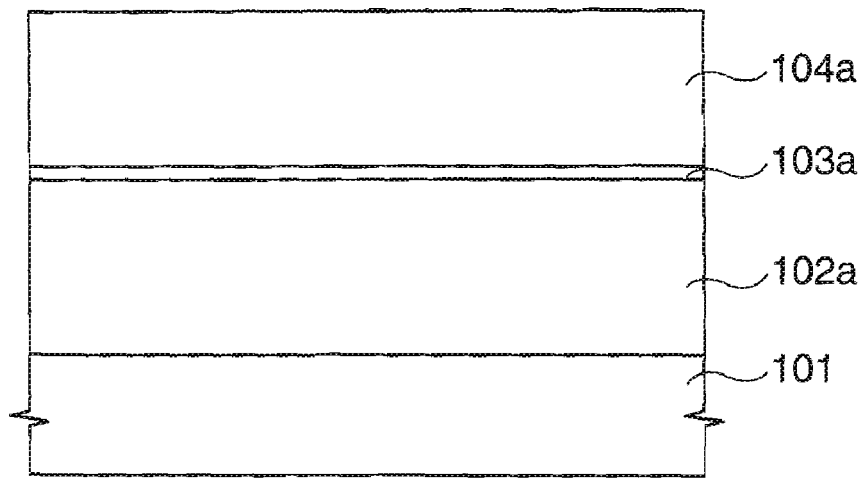
FIG. 3 is a view showing a step of a method for manufacturing a surface-emitting type semiconductor laser in accordance with an embodiment of the invention.
Figure 4:
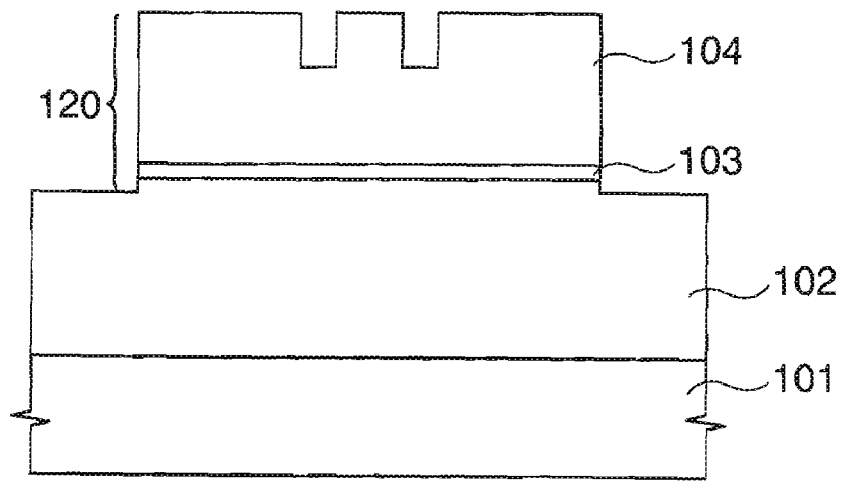
FIG. 4 is a view showing a step of the method for manufacturing a surface-emitting type semiconductor laser in accordance with the embodiment of the invention.
Figure 5:
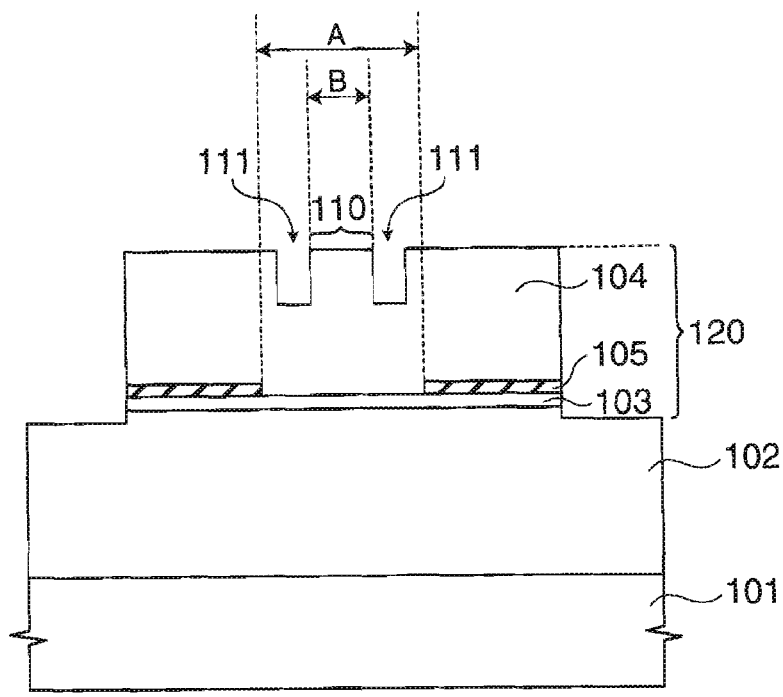
FIG. 5 is a view showing a step of the method for manufacturing a surface-emitting type semiconductor laser in accordance with the embodiment of the invention.

Next, an example of a method for manufacturing the surface-emitting type semiconductor laser 100 in accordance with an embodiment of the invention is described with reference to FIG. 3 through FIG. 5. FIG. 3 through FIG. 5 are cross-sectional views schematically showing a process for manufacturing the surface-emitting type semiconductor laser 100 shown in FIG. 1 and FIG. 2, and correspond to the cross-sectional view shown in FIG. 1, respectively.

(1) First, on a surface of a substrate 101 composed of an n-type GaAs layer, a semiconductor multilayer film is formed by epitaxial growth while modifying its composition, as shown in FIG. 3. It is noted here that the semiconductor multilayer film may be formed from, for example, a first mirror 102a of alternately laminated n-type $Al_{0.9}Ga_{0.1}As$ layers and n-type $Al_{0.1}Ga_{0.9}As$ layers, an active layer 103a composed of GaAs well layers and $Al_{0.3}Ga_{0.7}As$ barrier layers in which the well layers include a quantum well structure composed of three layers, and a second mirror 104a of alternately laminated p-type $Al_{0.9}Ga_{0.1}As$ layers and p-type $Al_{0.1}Ga_{0.9}As$ layers.

The temperature at which the epitaxial growth is conducted is appropriately decided depending on the growth method, the kind of raw materials, the type of the substrate 101, and the kind, thickness and carrier density of the semiconductor multilayer film to be formed, and in general, for example in MOCVD case, may preferably be 450° C.-800° C. Also, the time required for conducting the epitaxial growth is appropriately decided just like the temperature. Furthermore, a metal-organic vapor phase growth (MOVPE: metal-organic vapor phase epitaxy) method, a molecular beam epitaxy (MBE) method or a liquid phase epitaxy (LPE) method can be used as a method for the epitaxial growth.

(2) Then, the first mirror 102a, the active layer 103a and the second mirror 104a are patterned in a desired configuration by using known lithography technique and etching technique, thereby forming a columnar section 120. Furthermore, concave sections 111 are formed in the second mirror 104 by using appropriate techniques including photolithography technique, etching technique and electron beam processing technique (see FIG. 4).

(3) Next, by placing the first columnar section 120 in a water vapor atmosphere at about 400° C., for example, a layer having a high Al composition in the above-described second mirror 104 is oxidized from its side surface, whereby a current constricting section 105 is formed (see FIG. 5). In this step, the processing time, etc. are adjusted so that the inner diameter of the current constricting section 105 becomes greater than the diameter inside the concave sections 111.

The oxidation rate depends on the furnace temperature, the amount of water vapor that is supplied, and the Al composition and the film thickness of the layer to be oxidized. In the surface-emitting type semiconductor laser 100 equipped with the current constricting section 105 that is formed by oxidation, electric current flows only in a portion where the current constricting section 105 is not formed (a portion that is not oxidized). Accordingly, by controlling the range of the current constricting section 105 to be formed in the step of forming the current constricting section 105 by oxidation, the current path can be controlled.

(4) Then, as shown in FIG. 1, a first electrode 114 and a second electrode 116 are formed. Prior to forming each of the electrodes, areas where the electrodes are to be formed may be washed by using a plasma treatment method or the like depending on the requirements. As a result, a device with more stable characteristics can be formed.

Then, photoresist is provided in areas other than forming regions where the first electrode 114 and the second electrode 116 are to be formed, and a single layer film or a multilayer film (not shown) of conductive material for electrodes is formed by, for example, a vacuum deposition method. Then portions of the multilayered film other than specified positions (in areas where the photoresist remains) are removed by a known lift-off method, whereby the electrodes are formed in desired regions.

Next, an annealing treatment is conducted in, for example, a nitrogen atmosphere according to the requirements. The temperature of the annealing treatment may be, for example, about 400° C. The annealing treatment may be conducted for, for example, about 3 minutes.

The process described above may be conducted for each of the electrodes, or a plurality of electrodes may be formed at the same time. It is noted that the second electrode 116 may be composed of, for example, a laminated film of an alloy of gold (Au) and germanium (Ge), and gold (Au). The first electrode 114 may be composed of, for example, a laminated film of platinum (Pt), titanium (Ti) and gold (Au). It is noted that the materials of the electrodes are not limited to those described above, and other known metal, alloy and laminated films of the aforementioned materials may be used.

By the process described above, the surface-emitting type semiconductor laser 100 in accordance with the present embodiment shown in FIG. 1 and FIG. 2 is obtained.

3. MODIFIED EXAMPLES

Next, modified examples in accordance with the present embodiment are described with reference to the accompanying drawings.

3.1. First Modified Example

Figure 6:
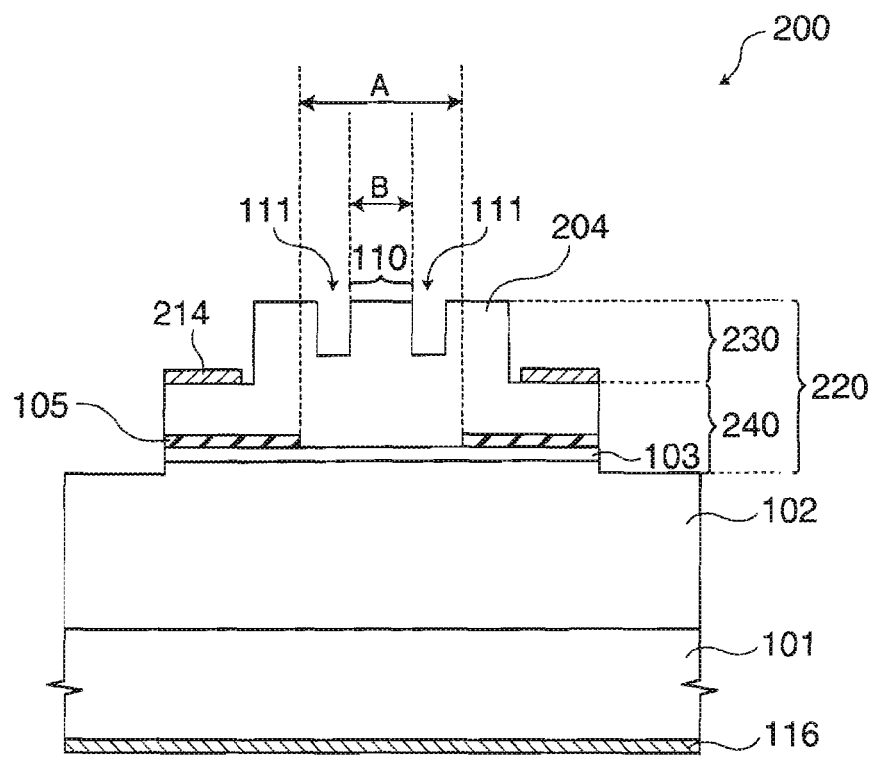
FIG. 6 is a schematic cross-sectional view of a surface-emitting type semiconductor laser in accordance with a first modified example of the embodiment of the invention.

FIG. 6 is a schematic cross-sectional view of a surface-emitting type semiconductor laser 200 in accordance with a first modified example. The surface-emitting type semiconductor laser 200 in accordance with the first modified example is different from the surface-emitting type semiconductor laser 100 of the above-described embodiment in that a first electrode 214 is provided near the current constricting section 105. The surface-emitting type semiconductor laser 200 includes a first columnar section 220 composed of a part of a first mirror 102, an active layer 103 and a second mirror 204. The first columnar section 220 includes a second columnar section 230 provided in its upper portion, and a third columnar section 240 provided in its lower portion. The second columnar section 230 is formed above the layer where the current constricting section 105 is provided. The third columnar section 240 includes a portion of the first mirror 102, the active layer 103, a portion of the second mirror 204, and a current constricting section 105. A first electrode 214 is formed on a top surface of the third columnar section 240. Therefore, by improving the conductivity of the topmost layer of the third columnar section 240, current injection can be more uniformly conducted. Accordingly, a GaAs layer that does not contain Al or an AlGaAs layer that hardly contains Al may preferably be formed in a region of the topmost layer of the third columnar section 240 on which the first electrode 214 is to be formed.

Because the first electrode 214 is provided near the current constricting section 105 as described above, the surface-emitting type semiconductor laser 200 can reduce heat that may be generated by the current flowing through the second mirror 204.

It is noted that other portions of the structure and manufacturing process for the surface-emitting type semiconductor laser 200 in accordance with the first modified example are generally the same as those of the structure and manufacturing process applied to the surface-emitting type semiconductor laser 100 in accordance with the embodiment described above, and therefore their description is omitted.

3.2. Second Modified Example

Figure 7:
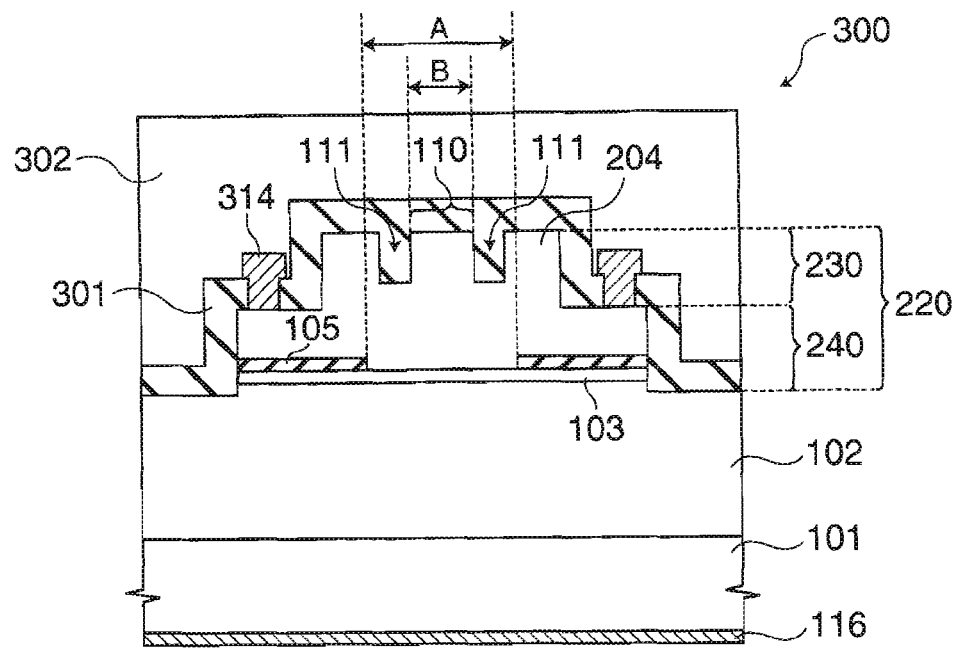
FIG. 7 is a schematic cross-sectional view of a surface-emitting type semiconductor laser in accordance with a second modified example of the embodiment of the invention.

FIG. 7 is a schematic cross-sectional view of a surface-emitting type semiconductor laser 300 in accordance with a second modified example. The surface-emitting type semiconductor laser 300 in accordance with the second modified example is different from the surface-emitting type semiconductor laser 100 of the above-described embodiment in that the surface-emitting type semiconductor laser 300 is further equipped with a transparent dielectric film 301 and a heat radiation film 302. The transparent insulation film 301 transmits light emitted from the surface-emitting type semiconductor laser 300 and is composed of insulation material. The transparent insulation film 301 may be composed of, for example, a silicon nitride (SiN) thin film. The silicon nitride thin film not only has light transmittivity and insulating property, but also excels in oxidation resisting property, such that the silicon nitride thin film can prevent oxidation and deterioration of the surface-emitting type semiconductor laser 300. The heat radiation film 302 transmits light at least in a region above an emission surface of the surface-emitting type semiconductor laser 300, and is composed of a material having a high thermal conductivity. The heat radiation film 302 may be composed of, for example, silicon carbide (SiC), diamond (diamond-like-carbon), or sapphire.

The transparent insulation film 301 and the heat radiation film 302 are composed of materials that transmit light emitted from the surface-emitting type semiconductor laser 300, such that the surface-emitting type semiconductor laser 300 can emit laser light upwardly. Also, the surface-emitting type semiconductor laser 300 has improved heat radiation efficiency because it is equipped with the transparent insulation film 301 and the heat radiation film 302. As a result of the above, an elevation of the device temperature by the current injection can be suppressed.

Next, an example of a method for manufacturing the surface-emitting type semiconductor laser 300 is described. The steps (1)-(3) for manufacturing the surface-emitting type semiconductor laser 100 in accordance with the embodiment described above are conducted, and then a transparent insulation film 301 is formed. The transparent insulation film 301 is formed and patterned by known methods. For forming a silicon nitride thin film as the transparent insulation film 301, a plasma CVD (Chemical Vapor Deposition) method may be used.

Next, a first electrode 314 and a second electrode 116 are formed by the method described above, and a heat radiation film 302 is formed. As the heat radiation film 302, silicon carbide, diamond, sapphire or the like can be used, as described above. For example, a sputter method may be used as the film forming method to form a silicon carbide or sapphire film. For example, a CVD method, a sputter method or a thermoelectron impact method may be used as the film forming method to form a diamond film. Then, patterning may be conducted by etching or the like to thereby expose a lead-out section of the first electrode 314. Alternatively, a lead-out section of the first electrode 314 may be exposed by a lift-off method in which a resist layer is left in advance on an upper surface of the lead-out section, and the resist layer is removed after forming the film.

By the process described above, the surface-emitting type semiconductor laser 300 is manufactured. It is noted that other portions of the structure and manufacturing process for the surface-emitting type semiconductor laser 300 in accordance with the second modified example are generally the same as those of the structure and manufacturing process for the surface-emitting type semiconductor laser 100 in accordance with the embodiment described above, and therefore their description is omitted.

3.3. Third Modified Example

Figure 8:
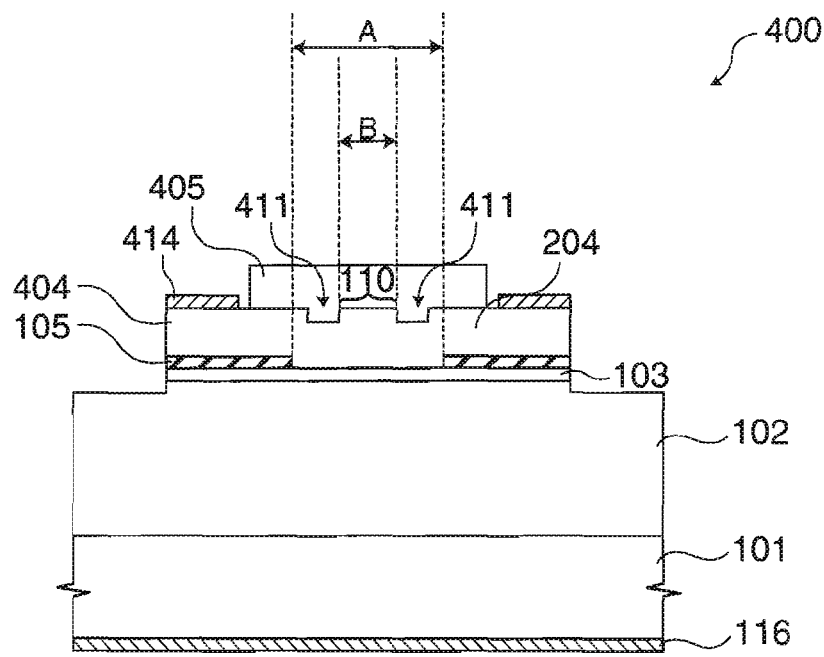
FIG. 8 is a schematic cross-sectional view of a surface-emitting type semiconductor laser in accordance with a third modified example of the embodiment of the invention.

FIG. 8 is a schematic cross-sectional view of a surface-emitting type semiconductor laser 400 in accordance with a third modified example. The surface-emitting type semiconductor laser 400 in accordance with the third modified example is different from the surface-emitting type semiconductor laser 100 of the above-described embodiment in that the surface-emitting type semiconductor laser 400 is further equipped with a dielectric layer 405 above a second mirror 404. The dielectric layer 405 may be composed of alternately laminated layers having different refractive indexes, and can function as a mirror like the second mirror 404. The dielectric layer 405 has a plane configuration that is in, for example, a circular shape having a smaller diameter than that of the second mirror 404, but may not be limited to this particular embodiment. Furthermore, concave sections 411 may be formed in the top surface of the second mirror 404. The concave sections 411 may be formed only in the dielectric layer 405, or the concave sections 411 may be formed in a manner to penetrate the dielectric layer 405 to the second mirror 404. Also, portion of the dielectric layer 405 may extend into the concave section 411. As a result, light confinement occurs by the difference between the refractive index of the second mirror 404 and the refractive index of the dielectric layer 405 embedded in the concave sections 411, and the number of oscillation modes is determined by a diameter B inside of the concave sections 411.

Furthermore, by forming the dielectric layer 405 that can function as a mirror above the second mirror 404, the film thickness of the second mirror 404 can be made smaller. As a result, the concave sections 411 can be formed near the active layer 103, such that the oscillation mode can be more effectively controlled.

Also, a first electrode 414 is formed on the top surface of the second mirror 404. The first electrode 414 may be formed around the dielectric layer 405. In the surface-emitting type semiconductor laser 400 in accordance with the third modified example, the film thickness of the second mirror 404 can be made smaller, as described above, the distance in which current flows through the second mirror 404 can be made shorter. As a result, the resistance can be lowered, and heat generation can be reduced.

The dielectric layer 405 may be formed with $Ta_2O_3$, $TiO_2$, $Ti_2O$, Ti, $SiO_2$, SiN or the like, and may be composed of a film of alternately laminated $SiO_2$ and SiN layers. The dielectric layer 405 can be formed with Si and $SiO_2$. The dielectric layer 405 may be formed by, for example, plasma CVD, sputtering or the like.

When the mirror is provided using dielectric layers in a manner described above, the refractive index ratio among the layers can be made greater, and the number of pairs can be reduced, compared to the case where the mirror is formed without using dielectric layers. By this, the material resource can be reduced.

It is noted that other portions of the structure and manufacturing process for the surface-emitting type semiconductor laser 400 in accordance with the third modified example are generally the same as those of the structure and manufacturing process applied to the surface-emitting type semiconductor laser 100 in accordance with the embodiment described above, and therefore their description is omitted.

3.4. Fourth Modified Example

Figure 9:
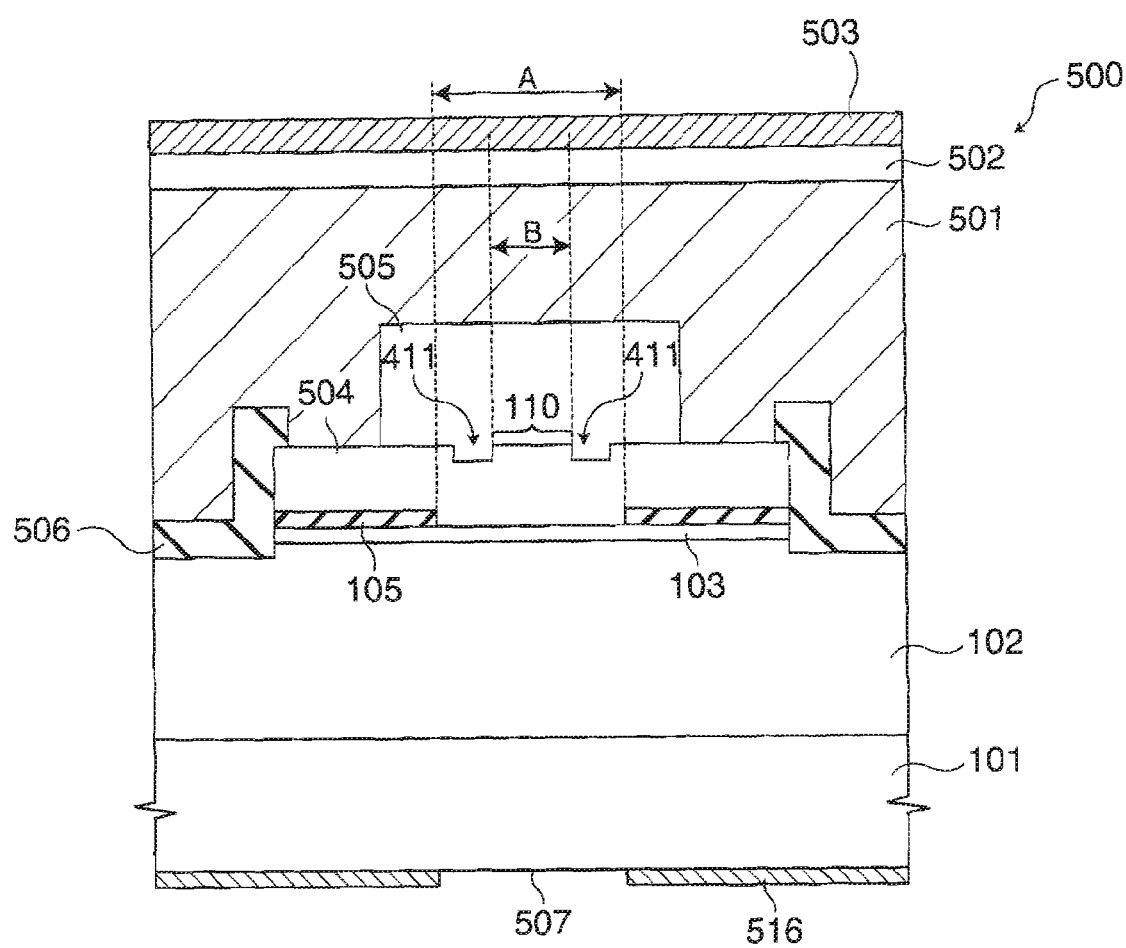
FIG. 9 is a schematic cross-sectional view of a surface-emitting type semiconductor laser in accordance with a fourth modified example of the embodiment of the invention.

FIG. 9 is a schematic cross-sectional view of a surface-emitting type semiconductor laser 500 in accordance with a fourth modified example. The surface-emitting type semiconductor laser 500 in accordance with the fourth modified example is different from the surface-emitting type semiconductor laser 100 of the above-described embodiment in that the surface-emitting type semiconductor laser 500 is further equipped with a conductive film 501, a first heat radiation film 502, a second heat radiation film 503 and an insulation film 506, and does not have a first electrode 114. The surface-emitting type semiconductor laser 500 in accordance with the fourth modified example has a laser light emission surface 507 in its lower side, and is therefore different from the surface-emitting type semiconductor laser 100 of the above-described embodiment that has an emission surface in its upper side.

The surface-emitting type semiconductor laser 500 in accordance with the fourth modified example further includes a dielectric layer 505 formed on the top surface of the second mirror 504, like the surface-emitting type semiconductor laser 400 in accordance with the third modified example.

The conductive film 501 is composed of a conductive material, such as, for example, gold-tin (AuSn) and the like, and can function as an electrode for driving the surface-emitting type semiconductor laser 500. The conductive film 501 is formed in a manner to cover the dielectric layer 505, and is in contact with the top surface of the second mirror 504.

The first heat radiation film 502 is formed above the conductive film 501. The first heat radiation film 502 is composed of a material having a high thermal conductivity. The first heat radiation film 502 may be composed of, for example, silicon carbide (SiC), diamond (diamond-like-carbon), sapphire or the like. The second heat radiation film 503 is formed above the first heat radiation film 502. The second heat radiation film 503 is composed of a material having a high thermal conductivity. When the second heat radiation film 503 is composed of a conductive material such as copper, the second heat radiation film 503 can function as a wiring when it is electrically connected to the conductive film 501. The insulation film 506 is formed in a manner to cover the circumference of the second mirror 504, the current constricting section 105 and the active layer 103, and the top surface of the first mirror 102.

The semiconductor substrate 101 may be composed of a transparent substrate that transmits light emitted from the surface-emitting type semiconductor laser 500. On the other hand, when a transparent substrate is not used, an etching stopper layer may be provided on the substrate 101 before the first mirror 102a is laminated, and an emission aperture may be provided by etching conducted from the back surface side. A second electrode 516 is formed on the back surface of the semiconductor substrate 101, and has an emission surface 305 in a region surrounded by the second electrode 516. By this, the surface-emitting type semiconductor laser 500 can emit laser light downwardly.

Next, an example of a method for manufacturing the surface-emitting type semiconductor laser 500 is described. First, the steps (1)-(3) for manufacturing the surface-emitting type semiconductor laser 100 in accordance with the embodiment described above are conducted, and then a dielectric layer 505 is formed by the method described above. Next, a second electrode 516 is formed, and then an insulation film 506 is formed. The material of the insulation film 506 is not particularly limited, but can be composed of, for example, a silicon nitride thin film. The silicon nitride thin film may be formed by the method described above.

Next, after forming a first heat radiation film 502 on a second heat radiation film 503, a conductive film 501 such as a solder film is coated on the first heat radiation film 502. Then, the first mirror 102, the active layer 103 and the second mirror 104 are embedded in the conductive film 501, and then the conductive film 501 is hardened.

By the process described above, the surface-emitting type semiconductor laser 500 is manufactured. In this manner, the surface-emitting type semiconductor laser 500 is equipped with the conductive film 501 that can function as an electrode and heat sink, which can contact the second mirror 104 in a wider area, whereby its heat radiation efficiency can be increased. By this, an elevation in the device temperature by current injection can be suppressed. Also, the surface-emitting type semiconductor laser 500 is equipped with the first heat radiation film 502 and the second heat radiation film 503 having high thermal conductivity, which can further increase the heat radiation efficiency.

It is noted that other portions of the structure and manufacturing process for the surface-emitting type semiconductor laser 500 in accordance with the fourth modified example are generally the same as those of the structure and manufacturing process for the surface-emitting type semiconductor laser 100 in accordance with the embodiment described above, and therefore their description is omitted.

The invention is not limited to the embodiments described above. For example, a transparent insulation film 301 and a heat radiation film 302 in accordance with the second modified example may be provided above the surface-emitting type semiconductor laser 400 in accordance with the third modified example. The invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that maintain the same functions and effects or maintain the same objects of those of the compositions described in the embodiments. Furthermore, the invention includes compositions that include publicly known technology added to the compositions described in the embodiments.

What is claimed is:

1. A surface-emitting type semiconductor laser comprising:
   a first mirror;
   an active layer formed above the first mirror;
   a second mirror formed above the active layer;
   a current constricting section formed above or below the active layer,
   the second mirror having a plurality of concave sections arranged within a plane perpendicular to a light emission direction;
   a depth of each of the plurality of concave sections being smaller than the thickness of the second mirror;
   a light confining region surrounded by the concave sections being formed inside a region surrounded by the current constricting section as viewed in a plan view; and
   a dielectric mirror formed above the second mirror, a lowermost layer of the dielectric mirror being embedded in the concave sections.

2. A surface-emitting type semiconductor laser comprising:
   a first mirror;
   an active layer formed above the first mirror;
   a second mirror formed above the active layer;
   a current constricting section formed above or below the active layer,
   the second mirror having a plurality of concave sections arranged within a plane perpendicular to a light emission direction;
   a light confining region surrounded by the concave sections being formed inside a region surrounded by the current constricting section as viewed in a plan view; and
   a first columnar section formed from at least the active layer, the second mirror and the current constricting section,
   the first columnar section including a third columnar section having the active layer and the current constricting section and a second columnar section formed above the third columnar section, and an electrode formed on a top surface of the third columnar section and around the second columnar section.

3. A surface-emitting type semiconductor laser comprising:
   a first mirror;
   an active layer formed above the first mirror;
   a second mirror formed above the active layer;
   a current constricting section formed above or below the active layer,
   the second mirror having a plurality of concave sections arranged within a plane perpendicular to a light emission direction;
   a light confining region surrounded by the concave sections being formed inside a region surrounded by the current constricting section as viewed in a plan view; and
   a heat radiation film formed above the second mirror.

4. A surface-emitting type semiconductor laser according to claim 3, the heat radiation film having optical transparency.

5. A surface-emitting type semiconductor laser according to claim 3, the heat radiation film being composed of a conductive material, and further comprising an insulation layer having optical transparency provided between the second mirror and the heat radiation film.

6. A surface-emitting type semiconductor laser according to claim 5, the insulation film being embedded inside the concave sections.

7. A surface-emitting type semiconductor laser comprising:
   a first mirror;
   an active layer formed above the first mirror;
   a second mirror formed above the active layer;
   a current constricting section formed above or below the active layer,
   the second mirror having a plurality of concave sections arranged within a plane perpendicular to a light emission direction;
   a light confining region surrounded by the concave sections being formed inside a region surrounded by the current constricting section as viewed in a plan view;
   a conductive film formed on an entire surface above the second mirror;
   a first heat radiation film formed above the conductive film; and
   a second heat radiation film formed above the first heat radiation film,
   the conductive film functioning as an electrode for driving the surface-emitting type semiconductor laser, and the second heat radiation film being composed of a conductive material and being electrically connected to the conductive film.

8. A surface-emitting type semiconductor laser according to claim 1, the second mirror including a dielectric mirror.

* * * * *

UNITED STATES PATENT AND TRADEMARK OFFICE
CERTIFICATE OF CORRECTION

PATENT NO. : 7,397,835 B2 Page 1 of 1
APPLICATION NO. : 11/566402
DATED : July 8, 2008
INVENTOR(S) : Masamitsu Mochizuki It is certified that error appears in the above-identified patent and that said Letters Patent is hereby corrected as shown below:

Title page, item (75) should read   Inventor:   Masamitsu Mochizuki, Chino (JP)

Signed and Sealed this

Fourteenth Day of October, 2008

JON W. DUDAS
*Director of the United States Patent and Trademark Office*